United States Patent
Begun et al.

(10) Patent No.: US 7,948,196 B2
(45) Date of Patent: May 24, 2011

(54) PLURALITY OF CONFIGURABLE INDEPENDENT COMPUTE NODES SHARING A FAN ASSEMBLY

(75) Inventors: Ralph Murray Begun, Raleigh, NC (US); Raymond Mathew Clemo, Raleigh, NC (US); Karl Klaus Dittus, Durham, NC (US); Vinod Kamath, Raleigh, NC (US); Michael Sven Miller, Raleigh, NC (US); Warren Everett Price, Cary, NC (US); Whitcomb Randolph Scott, III, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 12/099,841

(22) Filed: Apr. 9, 2008

(65) Prior Publication Data

US 2009/0256512 A1 Oct. 15, 2009

(51) Int. Cl.
*G06F 1/20* (2006.01)
*H02P 31/00* (2006.01)
(52) U.S. Cl. .......................... 318/471; 318/268; 388/934
(58) Field of Classification Search .................. 318/268, 318/471–473; 388/934
See application file for complete search history.

(56) References Cited

U.S. PATENT DOCUMENTS

| | | | |
|---|---|---|---|
| 5,491,610 A | 2/1996 | Mok et al. | |
| 5,929,581 A | 7/1999 | Van Brocklin et al. | |
| 6,101,459 A | 8/2000 | Tavallaei et al. | |
| 6,134,667 A | 10/2000 | Suzuki et al. | |
| 6,268,664 B1 | 7/2001 | Rolls et al. | |
| 6,280,318 B1 | 8/2001 | Criss-Puszkiewicz et al. | |
| 6,735,499 B2 * | 5/2004 | Ohki et al. | 700/299 |
| 6,888,332 B2 * | 5/2005 | Matsushita | 318/471 |
| 6,972,952 B2 * | 12/2005 | Lee | 361/679.48 |
| 7,036,072 B1 * | 4/2006 | Sulistio et al. | 715/205 |
| 7,138,781 B2 * | 11/2006 | Murray et al. | 318/400.04 |
| 7,290,721 B2 * | 11/2007 | Cheng | 236/49.3 |
| 7,370,242 B2 * | 5/2008 | Chen et al. | 714/47 |
| 7,398,402 B2 * | 7/2008 | Park | 713/300 |
| 2004/0095723 A1 | 5/2004 | Tsai et al. | |
| 2007/0230123 A1 | 10/2007 | Hata et al. | |
| 2007/0281639 A1 | 12/2007 | Clidaras et al. | |

* cited by examiner

*Primary Examiner* — Bentsu Ro
(74) *Attorney, Agent, or Firm* — Cynthia G. Seal; Jeffrey L. Streets

(57) ABSTRACT

A system comprising a chassis that includes a plurality of modules and a fan assembly disposed in a distal end of the chassis for drawing air in parallel pathways through the plurality of modules. At least one of the modules is a compute module having a thermal sensor disposed to sense the temperature of air flowing across a processor mounted on a motherboard. The system further comprises a fan controller receiving output from the thermal sensor, wherein the fan controller operates the fan assembly to cool the plurality of modules and maintain the thermal sensor output within an operating temperature range. The fan controller controls the fan speed according to predetermined thermal profile settings associated with one of the compute modules received in the chassis. For example, the predetermined thermal profile settings may include a minimum fan speed, a maximum fan speed, and control loop feedback settings.

25 Claims, 9 Drawing Sheets

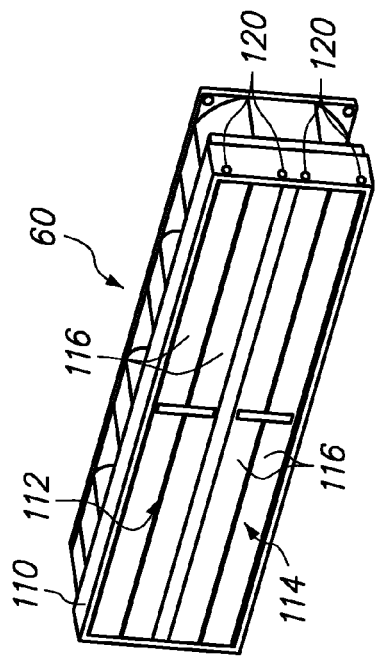
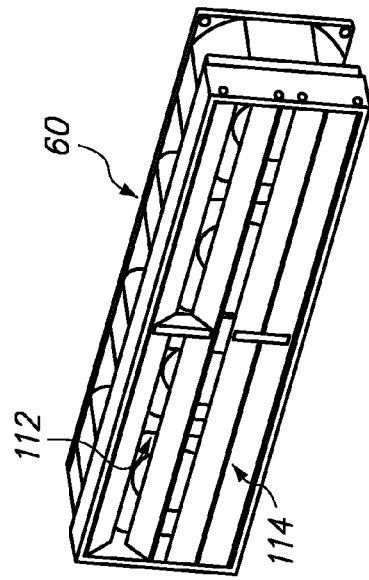
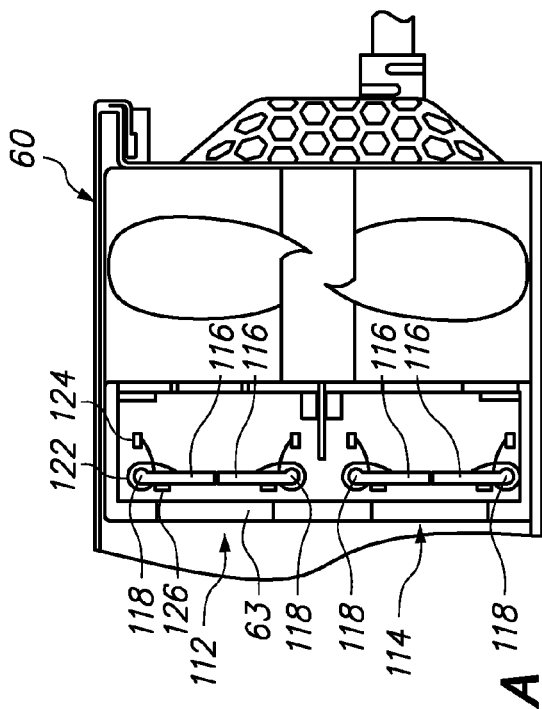
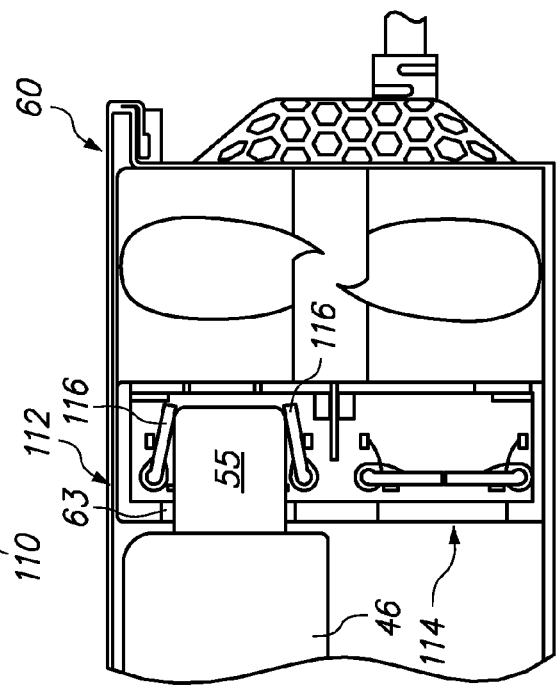

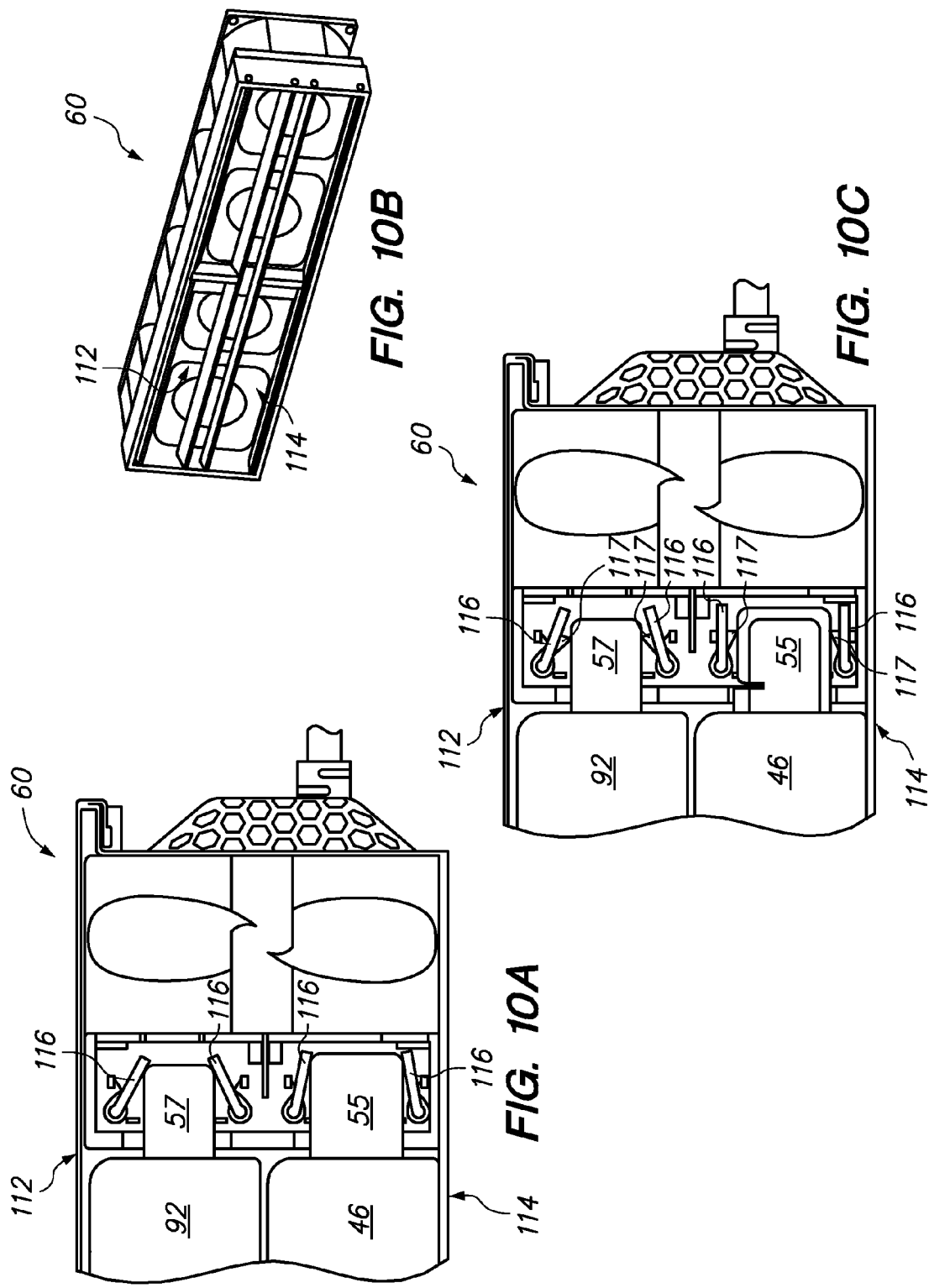

PLURALITY OF CONFIGURABLE INDEPENDENT COMPUTE NODES SHARING A FAN ASSEMBLY

BACKGROUND OF THE INVENTION

1. Field of the Invention

The present invention relates to methods of cooling computer systems, and more specifically to the operation of fans to flow air through computer systems.

2. Background of the Related Art

Computer systems come in various physical sizes, and in various configurations. These computer systems typically include fans, which circulate cool air through the system in order to keep the temperature of internal heat-generating components within thermal operating limits. Because small system fans are usually very inefficient from an electrical energy perspective, some chassis provide a common fan assembly that serves to cool multiple system boards.

Thermal limits are typically satisfied in a single motherboard/chassis arrangement by reading the internal CPU diodes and changing the speed of a dedicated fan assembly at prescribed temperature thresholds. However, this practice of reading CPU diodes can not be implemented easily in systems with shared infrastructure, such as systems with a shared fan assembly used to cool multiple system boards. In order to take advantage of the energy-efficient nature of a shared fans assembly in a chassis that supports multiple motherboards, a different thermal management scheme must be used.

One known thermal management scheme includes running the system fans at a constant elevated fan speed that will ensure adequate cooling of each of the multiple motherboards in the system chassis. This approach increases the amount of electrical energy consumed by operation of the fans, increases the thermal load on the datacenter from the excessive airflow through the fans, and increases the acoustic level caused by running the fans faster than is necessary to achieve optimal cooling.

Another thermal management scheme includes monitoring CPU diodes and inlet ambient conditions using a baseboard management controller (BMC) local to each system motherboard. These readings are then forwarded to a common control point (a Management Module) and chassis fan speeds are then adjusted accordingly. However, to implement this approach, each system board requires software customization to the local BMC and separate management module control hardware and software must be provided.

BRIEF SUMMARY OF THE INVENTION

One embodiment of the present invention provides a system comprising a chassis that includes a plurality of modules and a fan assembly disposed in a distal end of the chassis for drawing air in parallel pathways through the plurality of modules. At least one of the plurality of modules is a compute module, wherein each compute module includes a processor mounted on a motherboard and a thermal sensor disposed to sense the temperature of air flowing across the processor. The thermal sensor provides an output signal that varies according to the temperature. The system further comprises a fan controller receiving output from the thermal sensor of each compute module, wherein the fan controller operates the fan assembly to cool the plurality of modules and maintain the thermal sensor output within an operating temperature range. The fan controller controls the fan speed according to a predetermined thermal profile associated with one of the compute modules received in the chassis, wherein the predetermined thermal profile includes a minimum fan speed, a maximum fan speed, and control loop feedback settings.

Another embodiment of the present invention provides a method of controlling the fan assembly using a predetermined thermal profile code. The method comprises installing a plurality of modules into a chassis having a fan controller and fan assembly disposed in a distal end of the chassis for drawing air in parallel pathways through the plurality of modules. At least one of the plurality of modules installed in the chassis is a compute module, wherein each compute module includes a processor mounted on a motherboard and a thermal sensor disposed to sense the temperature of air flowing across the processor. The method further comprises providing a thermal profile identification code to the fan controller from one of the compute modules installed in the chassis. The fan controller operates using a predetermined thermal profile stored in memory in association with the thermal profile identification code, wherein the predetermined thermal profile includes control loop feedback settings. The plurality of modules is operated under a varying workload resulting in the generation of heat. The temperature of air downstream of the processor is sensed and the speed of the fan assembly is controlled as a function of the sensed temperature and the control loop feedback settings of the compute module installed in chassis.

BRIEF DESCRIPTION OF THE SEVERAL VIEWS OF THE DRAWINGS

FIGS. 8A and 8B provide a cross-sectional side view and a perspective view of the fan assembly of FIG. 7, with the air flow dampers closed.

FIGS. 9A and 9B provide a cross-sectional side view and a perspective view of the fan assembly of FIG. 7, with the upper air flow damper partially opened and the lower air flow damper closed.

FIGS. 10A and 10B provide a cross-sectional side view and a perspective view of the fan assembly of FIG. 7, with the upper and lower air flow dampers open.

FIG. 10C provides a cross-sectional side view of the fan assembly of FIG. 10A, wherein each of the individual damper blades include a ramp for contacting the damper actuator.

DETAILED DESCRIPTION OF THE INVENTION

Figure 1:
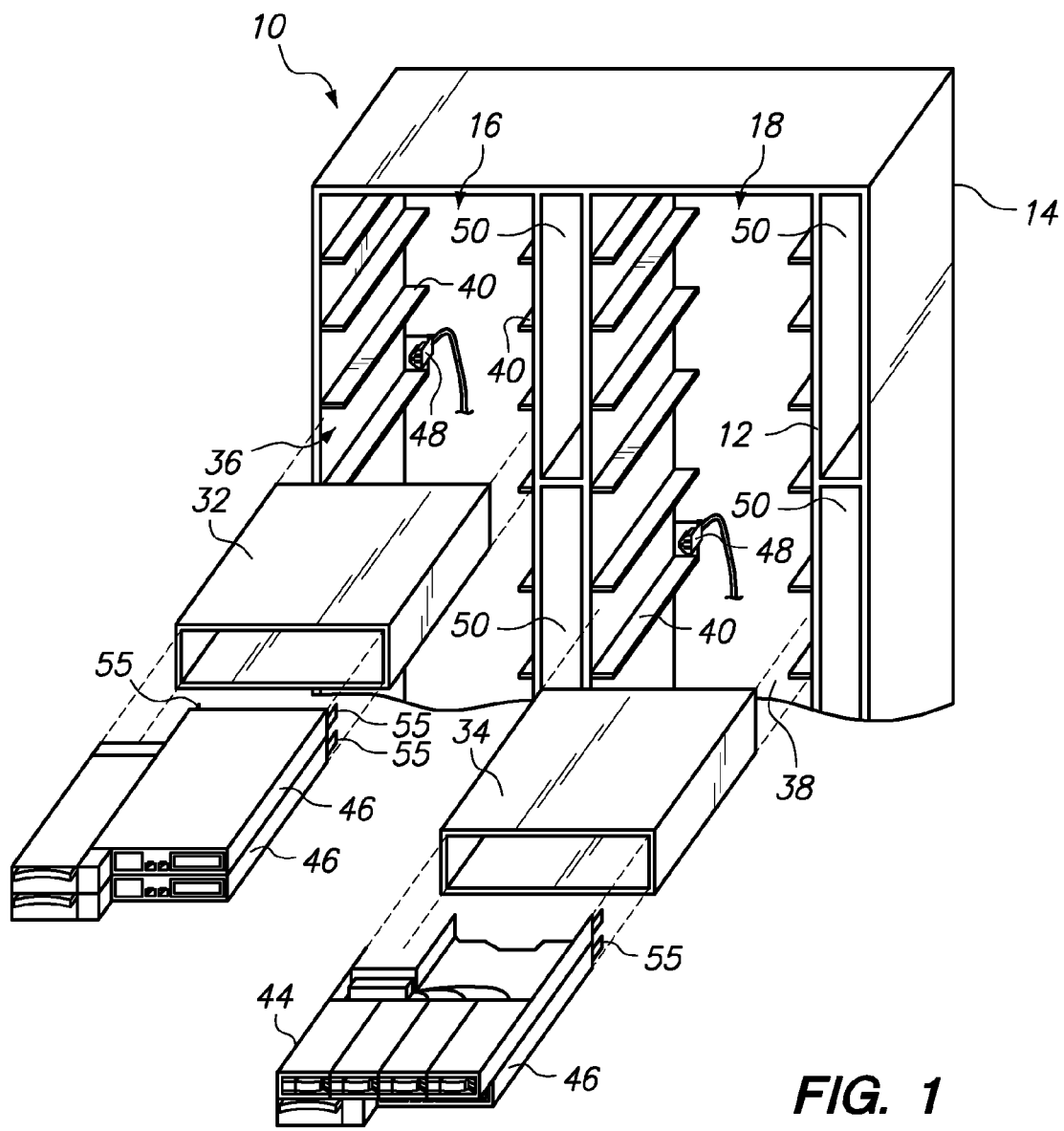
FIG. 1 is a perspective view of a rack receiving a pair of chassis, wherein each chassis is receiving two modules.

One embodiment of the present invention provides a system comprising a chassis that includes a plurality of modules and a fan assembly disposed in a distal end of the chassis for drawing air in parallel pathways through the plurality of modules. At least one of the plurality of modules is a compute module, wherein each compute module includes a processor mounted on a motherboard and a thermal sensor disposed to sense the temperature of air flowing across the processor. The thermal sensor provides an output signal that varies according to the temperature. Optionally, each compute module may include further thermal sensors for sensing the temperature of the processor, other components, or ambient air. The system further comprises a fan controller receiving output from the thermal sensor of each compute module, wherein the fan controller operates the fan assembly to cool the plurality of modules and maintain the thermal sensor output within an operating temperature range. The fan controller controls the fan speed according to a predetermined thermal profile associated with one of the compute modules received in the chassis, wherein the predetermined thermal profile includes a minimum fan speed, a maximum fan speed, and control loop feedback settings. Optionally, the fan controller may vary the fan speed between a minimum fan speed and a maximum fan speed in a set of incremental steps.

In another embodiment, the chassis further comprises a single, shared power supply providing electricity directly to the fan assembly and having a plurality of switchable outputs that provide electricity to each module received within the chassis. For example, a preferred configuration provides a chassis with a power supply having dual switchable outputs for providing electricity to each of two modules received within the chassis.

In yet another embodiment, each module includes a power paddle card for selective coupling to the power supply. Preferably, the power paddle card has a connector that blind docks with the power supply when the associated module is installed in the chassis. The power paddle transmits electrical power from the power supply to the components of the module and also provides communication between each compute module and the fan controller, which is preferably disposed within a common housing with the power supply. Specifically, the one or more thermal sensors of each compute module are electronically coupled to the power paddle so that the output of the thermal sensors can be communicated to the fan controller.

The fan controller uses the output of the thermal sensor(s) along with the thermal profile of the compute module to control the fan assembly, preferably controlling the speed of the fan assembly to maintain the temperature of the components with a specified operating range. For example, the fan controller may execute a fan speed control algorithm that sends a pulse-width-modulation (PWM) signal to the fan assembly. A preferred algorithm controls the speed of the fan assembly to adequately cool components of the computer system without using more electrical power than is necessary. For example, if the chassis includes only one compute module, then the fan controller may operate the fan assembly to control the processor temperature of the compute module as sensed by the thermal sensor(s). Furthermore, if the chassis includes two compute modules, then the fan controller receives output from the thermal sensor(s) of each of the two compute modules, and the fan controller may operate the fan assembly to control the processor temperature of the compute module having the thermal sensor with the highest temperature. However, the fan controller preferably uses a thermal profile of a single compute module, which may be selected, for example, by installation of the compute module in a module bay that provides a connection to the fan controller.

In a further embodiment, each compute module further includes a baseboard management controller for electronic communication with the fan controller, such as communicating through the power paddle. Accordingly, the baseboard management controller stores thermal profile settings for the compute module and attempts to communicate the thermal profile settings to the fan controller. If the compute module is provided in communication with the fan controller, then the fan controller will receive the compute modules' thermal profile settings. Optionally, the thermal profile settings are stored by the baseboard management controller and sent to the fan controller as power management bus (PMBus) codes.

In a still further embodiment, the chassis includes a plurality of module bays, wherein only one of the module bays has a power management bus connection to extend the power management bus of a compute module motherboard into communication with the fan controller. In this manner, the baseboard management controller of the compute module installed in the module bay having the power management bus connection, is responsible for storing and providing the thermal profile settings to the fan controller. Alternatively, each module bay may have a PMBus connection, but only one compute module should be provided with an internal PMBus cable. In either way, only one compute module is allowed to send its thermal profile settings to the fan controller.

The thermal sensors may be positioned anywhere in a compute module where the temperature can be closely correlated to the temperature of heat-generating components. For example, the workload and temperature of various heat-generating components in the compute module may be closely correlated to the workload and temperature of the processor, so a preferred position for the thermal sensor is directly behind each processor to measure the exhaust air temperatures. By externally coupling the thermal sensor to a heat sink or other feature of the motherboard, the thermal sensor can be easily added to any conventional motherboard configuration without customization.

In an additional embodiment, the thermal profile of a specifically configured motherboard tray or module can be determined by laboratory analysis. From this analysis, a desired range of airflow can be predetermined. A corresponding range of fan speed and/or feedback control settings are saved in association with a numerical code, referred to herein as a "node profile ID". These thermal profile settings are optimized to provide ideal cooling for a given module configuration. In order to minimize power consumption by the fan assembly, the fan controller algorithm should operate the fan assembly at the lowest speed that will maintain the output of the thermal sensor within the desired operating range.

For example, a laboratory test method may comprise installing a plurality of modules into a chassis having a fan assembly disposed in a distal end of the chassis for drawing air in parallel pathways through the plurality of modules, wherein at least one of the plurality of modules is a compute module, and wherein each compute module includes a processor mounted on a motherboard. A thermal sensor is positioned within the compute module to sense the temperature of air flowing across the processor. Next, the plurality of modules is operated under a varying workload and the temperature of a plurality of heat-generating devices within the plurality of modules is monitored. These temperatures may be monitored by a conventional data acquisition system or computer controller. The temperature of each device may then be correlated with the temperature of the thermal sensor and thermal profile settings may be determined. These thermal profile settings are eventually provided for use by a fan control algorithm to vary the speed of the fan assembly to maintain the temperature of each device within a desired device operating range as a function of the thermal sensor output. Establishing such a correlation and settings advantageously allows each component to be adequately cooled with a minimal number of thermal sensors. Although a single thermal sensor is sufficient, two or more thermal sensors are preferably utilized within each compute module.

Preferably, the test method determines thermal profile settings including a minimum fan speed for the fan assembly to maintain the temperature of each device with a desired device operating range at a minimum workload. Such a minimum fan speed should be maintained any time that the computer system is turned on. It is also preferable that the test method determine thermal profile settings that include a maximum fan speed for the fan assembly to maintain the temperature of each device with a desired device operating range at a maximum workload. In order for the test method to determine suitable control loop feedback settings, the method will preferably include a variety of potential changes in workload, such as a rapid increase in workload. Accordingly, the control loop feedback settings, which may include proportional-integral-derivative constants or values, may be determined so that any change in the thermal sensor output causes a resulting change in the fan speed that will adequately cool each of the heat-generating components, not just the processor.

Furthermore, the test method is preferably performed for each of a plurality of different compute module configurations in order to determine thermal profile settings that are specific for that module configuration. Still further, the test method may be performed for each of a plurality of different module combinations to determine thermal profile settings for each combination of modules. The resulting thermal profile settings for each module are preferably associated with a thermal profile identification code.

Still further, the chassis may further comprise an air flow damper disposed between each module and the fan assembly to selectively distribute the air flow among the plurality of modules received in the chassis. By performing the test method with the air flow dampers set in the same position (i.e., percent open) that they will be set in operation, the most appropriate thermal profile settings may be determined. A passive mechanism for assuring that the dampers are consistently positioned is described below.

In another embodiment, the module configuration is then mapped during the manufacturing process to a specific node profile identification, which is then associated with a matching label or part number, which may be printed and applied to the module. The thermal profile settings that were predetermined, for example using the foregoing test method, are retrieved from memory in association with the node profile identification or part number.

During assembly of a computer system, such as a full rack of various types and configurations of modules, the label printed on the top cover of each compute module or planar tray will define the correct thermal profile to be used for that module. If two compute modules are installed, they preferably have the same configuration so that the thermal profile setting for one of the compute modules are used for either or both of the compute modules.

Also during assembly of the computer system, the node profile identification code is used in order to program the thermal profile settings into the baseboard management controller (BMC). Preferably, a bootable software utility is loaded to query the user to input the node profile identification codes to be used for each compute module being installed in the system. This software utility converts each node profile identification code into a series of OEM IPMI command codes that are then sent to be stored in the BMC. Every time the compute module begins to boot up, the BMC will send this series of pre-defined codes to the fan controller over the PMBus and the fan controller will retain these values in non-volatile memory. The command codes preferably provide the entire content of the thermal profile settings.

Another embodiment of the present invention provides a method of controlling the fan assembly using predetermined thermal profile codes and settings. The method comprises installing a plurality of modules into a chassis having a fan controller and fan assembly disposed in a distal end of the chassis for drawing air in parallel pathways through the plurality of modules. At least one of the plurality of modules installed in the chassis is a compute module, wherein each compute module includes a processor mounted on a motherboard and a thermal sensor disposed to sense the temperature of air flowing across the processor. The method further comprises providing a thermal profile identification code to the fan controller. The fan controller operates using a predetermined thermal profile stored in memory in association with the thermal profile identification code, wherein the predetermined thermal profile settings includes control loop feedback settings. The plurality of modules is operated under a varying workload resulting in the generation of heat. The temperature of air downstream of the processor is sensed and the speed of the fan assembly is controlled as a function of the sensed temperature and the control loop feedback settings of the plurality of modules installed in chassis.

An Exemplary Apparatus Having an Optional Damper Assembly

In one non-limiting example, the previously described embodiments may be implemented in the context of an apparatus comprising a chassis having a proximal end that provides access to a plurality of module bays. One or more modules are each received in one of the module bays, wherein each module has at least one damper actuator distally extending from a distal end of the module. A fan assembly including a plurality of fans is secured in a distal end of the chassis. Between the module bays and the fan assembly is a plurality of air flow dampers, wherein each air flow damper is aligned with one module bay to control air flow through the aligned module bay. Each damper closes in the absence of contact with one of the damper actuators and opens in response to contact with at least one of the damper actuators. When a damper is contacted by a damper actuator as a result of one of the modules being received in one of the module bays, then the damper opens to a variable extent determined by the profile of the damper actuator that is contacting the damper.

The one or more modules of the apparatus may include first and second modules, wherein the first module has a damper actuator having a first profile aligned with a first damper and the second module has a damper actuator having a second profile aligned with a second damper. Optionally, the first module may have a thermal load that is greater than a thermal load of the second module, and the first damper actuator profile opens the first damper to a greater extent than the second damper actuator profile opens the second damper. Preferably, the air flow caused by the fan assembly is distributed between the first and second modules in proportion to the extent that the first and second dampers are open.

The fan assembly preferably includes a plurality of fans directed to draw air flow through the modules that have been received in the chassis and exhaust the air out the back (distal end) of the chassis. In a 2U chassis, each fan preferably has a housing that spans the width of both modules. Accordingly, the plurality of fans is arranged across the longer dimension of the chassis' back end.

In a further option, the dampers are pivotally secured to a frame. Such a frame is suitably about the same dimensions as the fan assembly intake. Accordingly, substantially all of the air flow induced by the fans is directly through the dampers. The air flow dampers are preferably biased toward a closed position, so that the dampers immediately close upon removal of a module from a module bay. In an exemplary configuration, each air flow damper may include a pair of damper blades that pivot apart upon inserting a damper actuator there between. Optionally, each damper blade may include a ramp positioned for contact with one of the damper actuators, such that the blades are opened even wider to allow greater air flow there through.

The damper actuators are constructed with a profile that, in cooperation with a known damper configuration, determines the extent to which the dampers will be opened. Accordingly, a module with a high thermal load will be constructed with a damper actuator that opens the dampers to a greater extent than will the damper actuators of a module with a low thermal load. For example, a compute module having a motherboard would be expected to produce a high thermal load and an expansion module having a set of disk drives would be expected to produce a low thermal load. In one embodiment, each module has two damper actuators spaced apart at the distal end of the module. The damper actuators for each module should be fixedly spaced relative to the module bay, so that inserting a module into the module bay will inherently align the damper actuator(s) of that module with the desired point on the dampers.

The apparatus may also include a protective grill disposed between the air flow dampers and the plurality of bays. The protective grill allows the passage of air without restriction, but prevents accidental contact of objects or fingers with the operating fans. Optionally, the protective grill may include passages to allow the damper actuators to engage the dampers. In a preferred embodiment, the protective grill is secured directly to the frame. Still further, the fan assembly, air flow dampers and protective grill may be secured together in a unitary fan pack.

A chassis may include any number of module bays, but the chassis preferably has two, three or four module bays. Optionally, the rack may receive a plurality of chassis with a different number of module bays, such as a rack receiving at least one chassis with two module bays (a 2U chassis) and at least one chassis with three module bays (a 3U chassis). The size of the chassis bays may be selectively configurable to receive any of the available chassis, such as by adjusting the elevation of a horizontal rail secured to a pair of vertical supports on either side of the chassis bays. The horizontal rails preferably run from front to back and provide support and alignment of the chassis into the rack.

The size of the chassis is selected on the basis of the number and type of modules that will be installed within the chassis. For example, a 2U chassis may include either two compute modules or one compute module and one expansion module. However, it is preferable that any chassis include at least one compute module and that the components in any expansion module will interface directly with a compute module within the same chassis, such as through an interface to a system bus or peripheral bus. These interconnections between modules are preferably made prior to installing the modules into a chassis. Each compute module should have an input/output panel on the front side of the module, wherein the input/output panel includes at least one input/output port for receiving a network cable.

DISCUSSION OF THE EMBODIMENT SHOWN IN THE DRAWINGS

FIG. 1 is a perspective view of a rack 10 receiving a first chassis 32 into a chassis bay 36 in the left hand column 16 of the rack 10 and a second chassis 34 into a chassis bay 38 in the right hand column 18 of the rack 10. The two chassis 32, 34 are received and supported on horizontal rails 40 that are spaced to accommodate the 2U chassis 32 and the 2U chassis 34. The vertical spacing between rails 40 is preferably adjustable to accommodate any combination of chassis having the same or different size.

Furthermore, the first 2U chassis 32 is receiving two 1U compute modules 46 and the second 2U chassis 34 is receiving a 1U compute module 46 and a 1U expansion module 44 including a bank of four disk drives. The 2U chassis 32 receives the two compute modules 46 independent of the other.

To the right of each column 16, 18 there are a plurality of network switch bays 50 that are suitable to receive a plurality of network switches (not shown). Having the network switch bays 50 located along the edge of the chassis bays 36, 38 facilitates network cable connections between compute modules and a network switch that are short, avoid interfering with access to adjacent modules, and allow the connections to be made from the front side 12 of the rack.

Furthermore, the lower left side rail 40 of each chassis bay 36, 38 secures an AC power cord connector 48 arranged in order to blind dock with a chassis power supply. As shown, the cord connector 48 is aligned with a mating connector on the power supply (See power supply 52 in FIG. 2) so that complete insertion of the chassis 32, 34 into the respective chassis bay 36, 38 completes the connection and supplies power to the respective power supply. No access from the back of the rack 10 is necessary to complete this connection. Furthermore, the damper actuators 55 extending distally from the distal end of each module 46, 44 may be considered to blind dock with the air flow dampers (not shown) that control air flow through the respective modules 46, 44.

Figure 2:
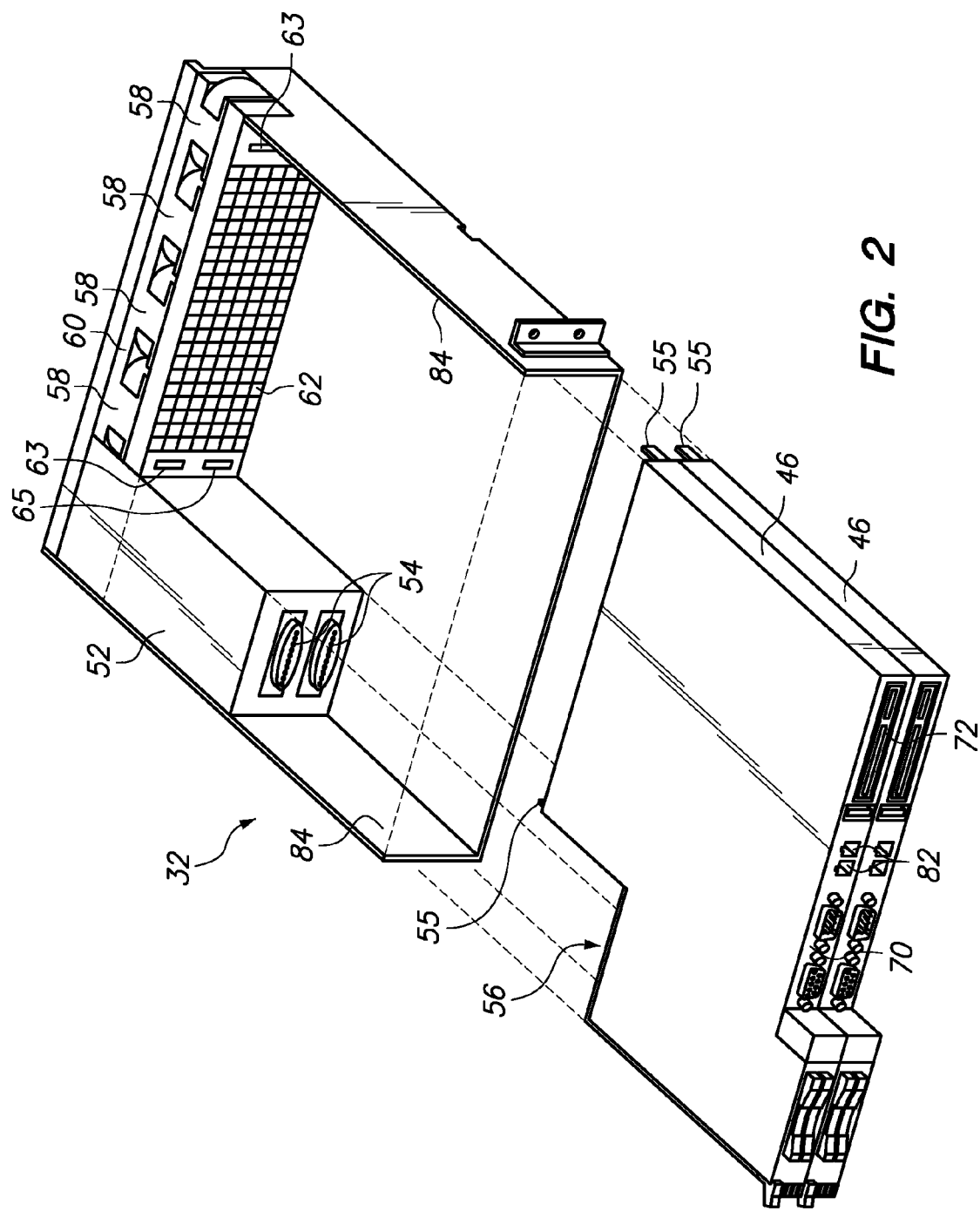
FIG. 2 is a perspective view of a chassis receiving two compute modules.

FIG. 2 is a perspective view of the first chassis 32 receiving the two compute modules 46. The 2U chassis 32 includes a power supply 52 having two front-facing connectors 54 for direct blind docking with mating connectors 56 (See FIG. 3A) on the compute modules 46. The 2U chassis 32 also includes an assembly or pack 60 of four fans 58 secured along the back of the chassis 32. The fan assembly 60 is shown with an air intake grill 62. Although the number of fans may vary, the 2U chassis 32 can accommodate larger diameter fans than a 1U module. Accordingly, the chassis 32 provides fewer, but larger fans that provide an air flow that is suitable to cool the module components while making more efficient use of electricity. Optionally, a 3U chassis might have only three or four fans of an even greater diameter.

The two compute modules 46 are preferably independently aligned and inserted into the chassis 32. Optionally, a single compute module may be installed or two compute modules may be installed separately as needed. In the embodiment shown, each individual compute module 46 includes an input/output panel 70 and a PCI slot 72. Furthermore, the input/output panel 70 includes standard network connectors, such as Ethernet connectors 82, which can be used to connect the compute module to a network switch (not shown) using an Ethernet cable. For purposes of this disclosure it is assumed that each compute module is similarly equipped although the number and types of components may vary.

Upon insertion into the chassis 32, the compute modules 46 are guided rearward along the side walls 84 of the chassis 32 until a rearward facing power connector 56 on each the two compute modules 46 has blind docked with one of the two front-facing connectors 54 on the power supply 52. The vertical spacing of the front-facing connectors 54 and the rearward-facing connector 56 is the same to facilitate their connection. Accordingly, the components within each compute module are supplied with power. Preferably, the fan assembly 60 is directly powered and controlled by the power supply 52 which gets thermal sensor data from sensors within the chassis and/or from the compute module itself. The distal end of each module 46 also includes a pair of damper actuators 55 extending distally in alignment with slots 63 formed in the protective grill 62. The operation of the damper actuators is discussed in greater detail below.

Figure 3A:
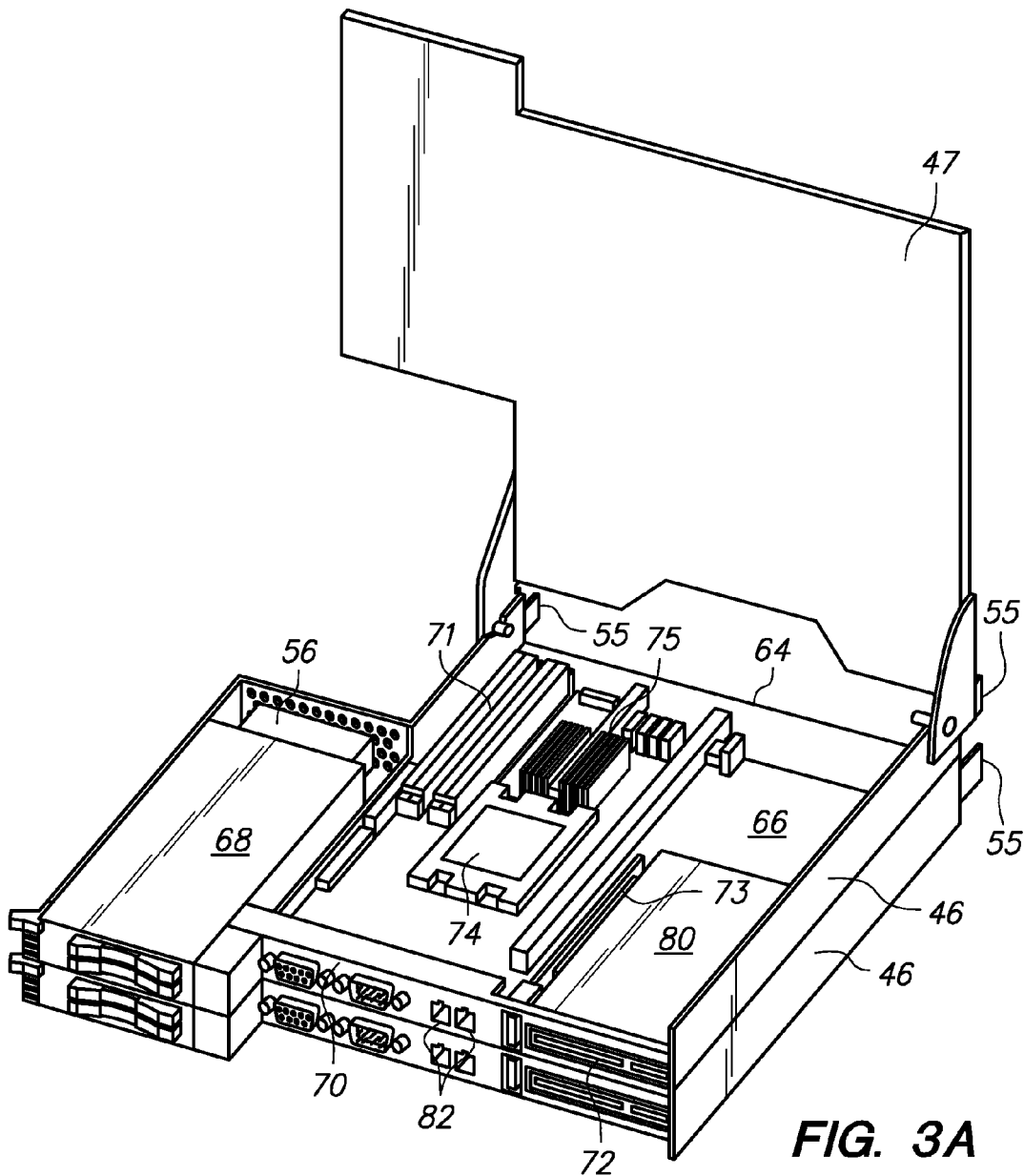
FIG. 3A is a perspective view of two compute modules, wherein the upper module has its top cover opened for illustration.

FIG. 3A is a perspective view of two compute modules 46, wherein the upper module has its top cover 47 opened for illustration. The module 46 includes a tray 64, a rearward facing power connector 56, a motherboard 66, and a hard disk drive 68. The motherboard 66 is preferably an industry standard motherboard, including a processor 74, a plurality of memory modules 71, a riser card 73 and a PCI card 80. Other components that are necessary or beneficial to the operation of the motherboard 66 are not necessarily shown, but it should be understood that such other components will be present on a functioning motherboard. Cable connections from the rearward-facing power connector 56 to the motherboard 66 and the hard disk drive 68 are also provided.

Figure 3B:
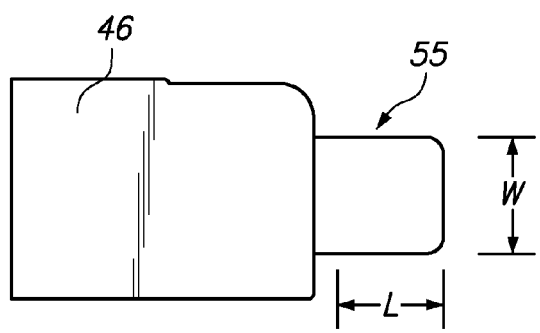
FIG. 3B is a side view of a damper actuator extending from a module.

FIG. 3B is a side view of a damper actuator 55 extending from a module 46. The damper actuators 55 preferably extend distally from parallel sides of the module 46. In this position, the actuators 55 do not interfere with air flow or cabling between modules and are easily inserted through slots in the grill. The damper actuators should be rigid in order to push open dampers as the module is received in a chassis. The damper actuators 55 of any given module 46 have a profile that determines how the actuator will engage and operate a damper. As shown in FIG. 3B, the profile of damper actuator 55 is substantially rectangular, as defined by a width W and a length L with rounded corners. However, the profile could also be curved or form part of a polygon. While the actuators 55 are preferably formed in generally parallel planes as defined by the sidewalls of the module 46, it should be recognized that the actuators may lie in other planes or be non-planar geometrical shapes.

Figure 4:
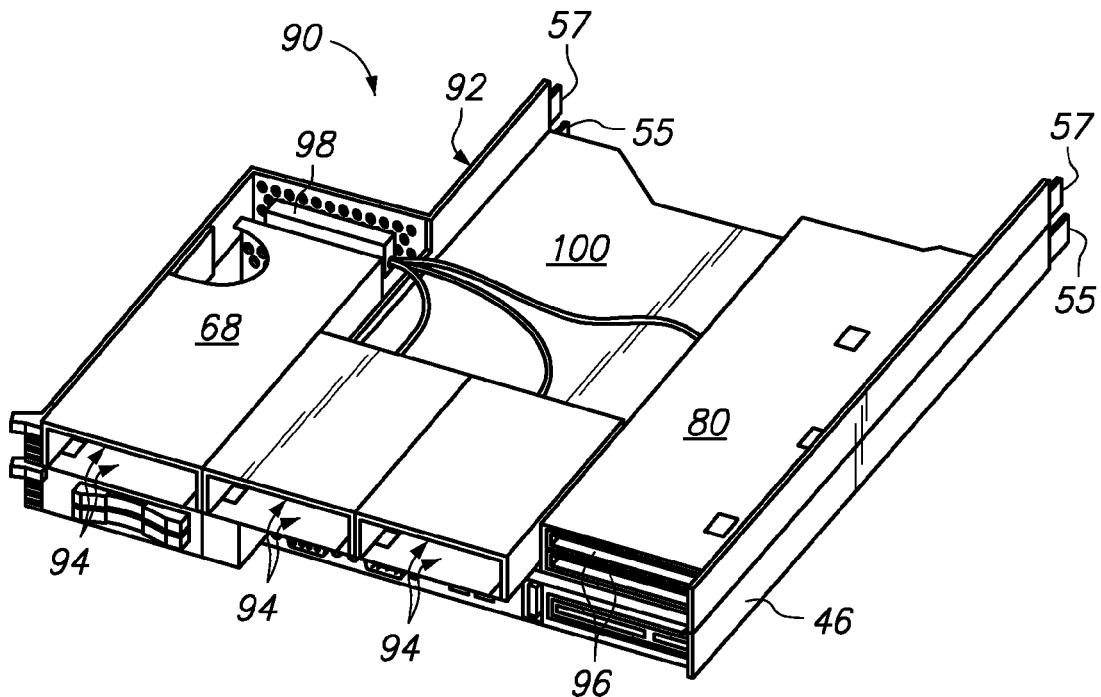
FIG. 4 is a perspective view of a compute module and an expansion module having different thermal loads.

FIG. 4 is a perspective view of a 2U computer subassembly 90 including a single compute module 46 and a first expansion module 92 secured above the compute module. The different configurations and components within these modules give them different thermal loads. An exemplary compute module 46 was described in relation to FIG. 3A. In FIG. 4, the first expansion module 92 has six small form factor hard disk drive bays 94 and two PCI slots 96. A rearward-facing power connector 98 is disposed on the expansion module tray 100 to directly blind dock with a power supply connector 54 (See FIG. 2) and provide power to each of the hard disk drive bays 94. One or more openings in the expansion module tray 100 allow one or more communication cable to extend between components installed in the expansion module 92 and the motherboard 66 in the compute module 46 that lies beneath the expansion module. Accordingly, it is preferably, but not absolutely necessarily, for the compute module and expansion module to be mechanically coupled to aid in their coordinated insertion into a chassis. Such mechanical coupling may include the use of any conventional fastener or fastening system, but is preferably simple and quick to couple and uncouple. For example, the mechanical coupling may be a simple set of tabs or hinge pins on one module that is aligned to be received in a slot in an adjacent module so that two modules will not slide relative to one another, but may be easily separated outside a chassis by lifting or rotating one module relative to the other. Both the expansion module 90 and the compute module 46 in FIG. 4 may then be installed in the same 2U chassis, such as the chassis 32 of FIG. 2.

Figure 5:
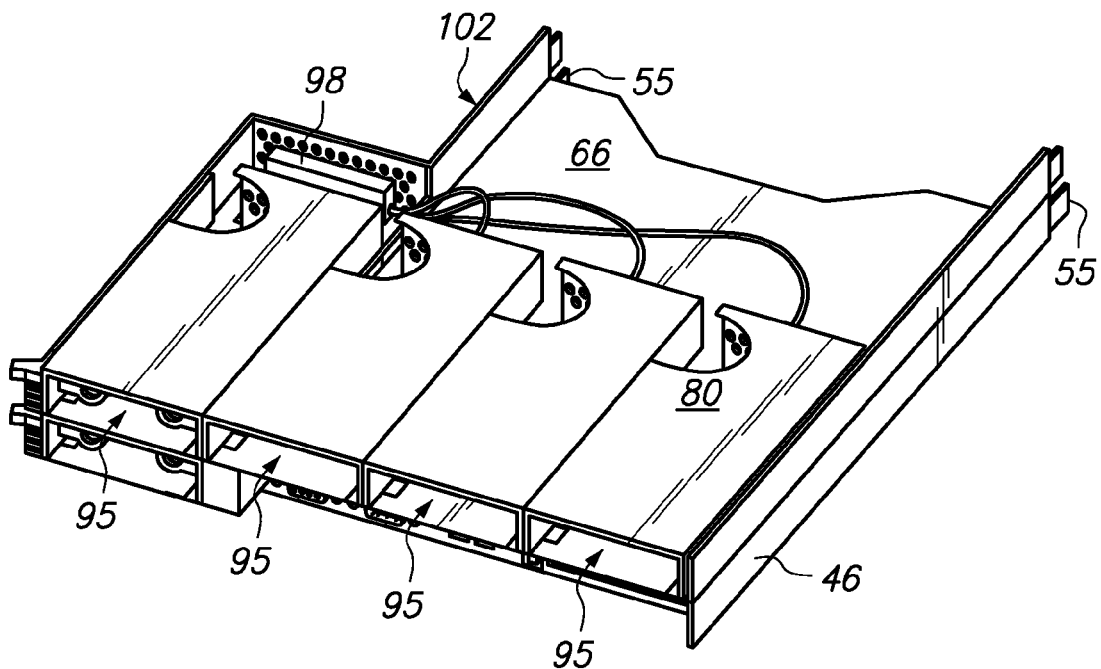
FIG. 5 is a perspective view of a compute module and a second expansion module having different thermal loads.

FIG. 5 is a perspective view of a 2U computer subassembly including a single compute module 46 and a second expansion module 102 secured to the compute module. The compute module 46, the expansion module 92 of FIG. 4, and the expansion module 102 of FIG. 5 each have different components resulting in different thermal loads. In particular, the second expansion module 102 includes four 3.5 inch hard disk drive bays 95 and no PCI slots.

Figure 6:
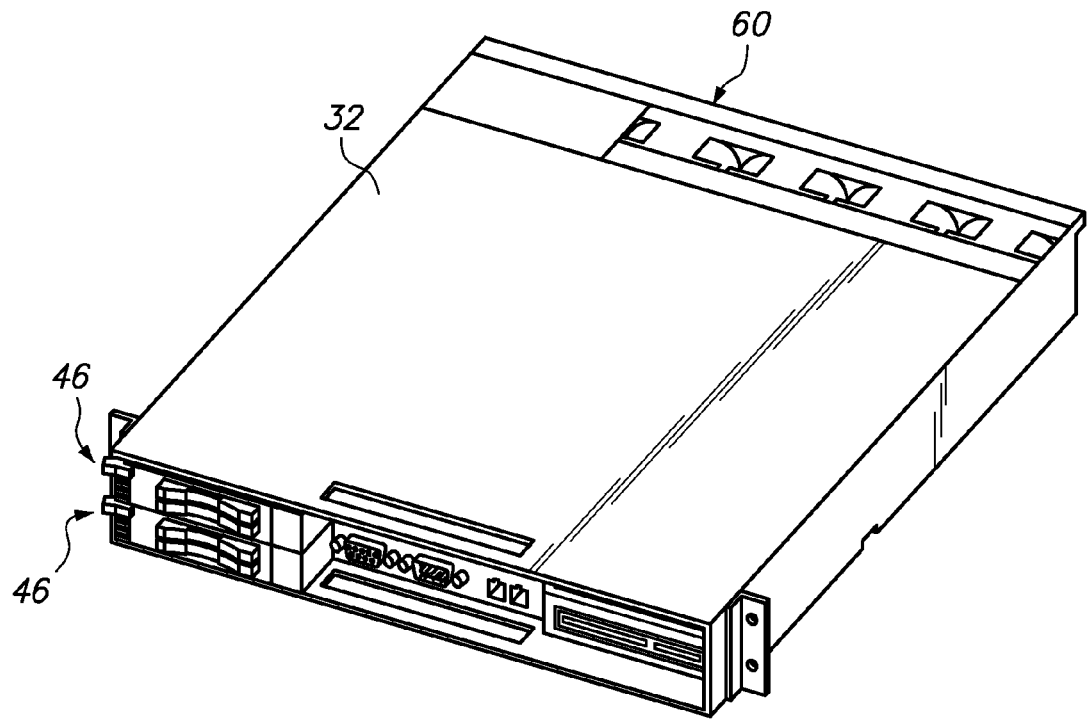
FIG. 6 is a perspective view of a 2U chassis having received two compute modules, wherein the top rear access cover has been removed to illustrate fan location.

FIG. 6 is a perspective view of a 2U chassis 32 having received two identical compute modules 46. At the distal end of the chassis 32, the fan assembly 60 is shown, wherein the chassis rear access cover has been removed for illustration.

Figure 7:
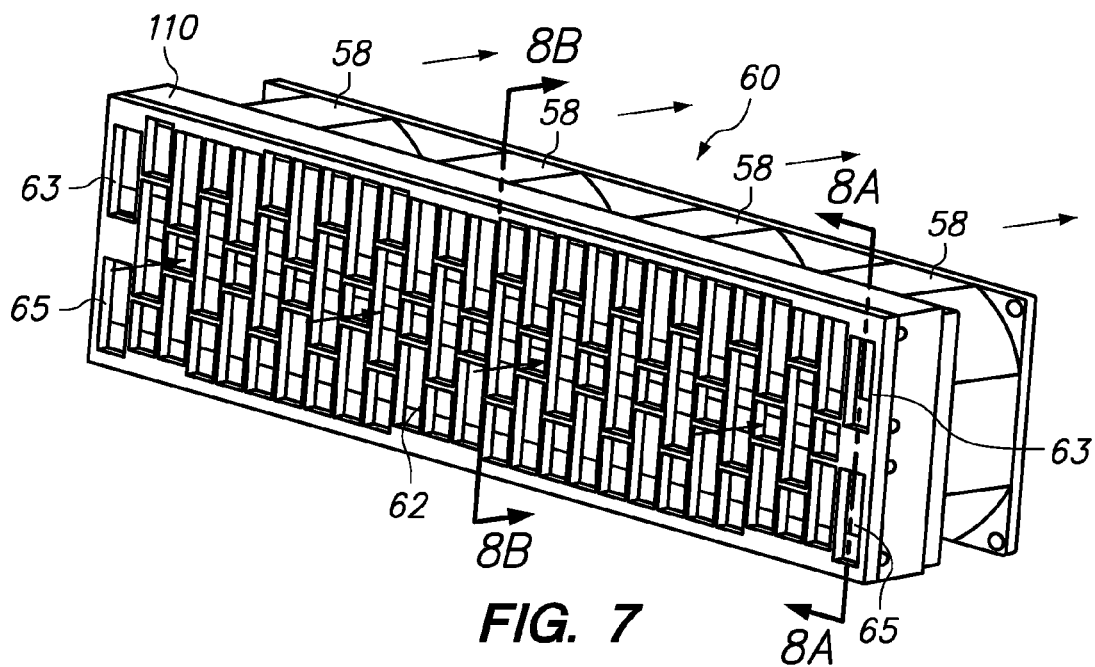
FIG. 7 is a perspective view of a fan assembly for use in the 2U chassis of FIG. 6.

FIG. 7 is a perspective view of the fan assembly 60 for use in the 2U chassis 32 of FIG. 6. The fan assembly 60 includes four fans 58 oriented to draw air through the protective intake grill 62 and exhaust air distally (as shown by the arrows). The protective grill 62 is secured to the fans 58 by a frame 110. The frame 110 pivotally secures individual damper blades (Shown in FIGS. 8A-B, 9A-B, and 10A-C) (shown in an open position) that provide a damper aligned with each bay of the chassis 32. Furthermore, the grill 62 includes two damper actuator slots 63 to align with the damper actuators of an upper module and two damper actuator slots 65 to align with the damper actuators of a lower module. Accordingly, the dampers are protected by the grill, but operable by damper actuators that extend into the slots.

FIGS. 8A and 8B provide a cross-sectional side view (taken along the section line 8A) and a perspective view (taken along the section line 8B) of the fan assembly 60 of FIG. 7, with the air flow dampers closed. FIG. 8A is a shows a first damper 112 and a second damper 114 each including upper and lower damper blades 116 that pivot about an axle or pivot pin 118. Each pivot pin 118 is received within a mating hole or bearing 120 in the frame 110. Accordingly, a pivot pin 118 at each end of a damper blade 112 is pivotally secured. Furthermore, each damper blade may be further pivotally supported along the length of the damper blade.

A coil spring 122 is disposed about the pivot pin 118 and having a first end biased against a shoulder 124 and a second end biased against the damper blade, such that the damper blade is biased toward a closed position (as shown). Optionally, the frame or grill may further include a second shoulder or surface 126 to stop the damper blade in a vertical position when closed.

FIG. 8B is perspective view of the fan assembly 60 taken along the section line 8B in FIG. 7, so that the grill 62 has been removed to further illustrate the dampers 112, 114. As shown in FIG. 8B, both dampers 112, 114 are closed, because no damper actuator has made contact with the damper blades (See corresponding FIG. 8A).

FIGS. 9A and 9B provide a cross-sectional side view and a perspective view of the fan assembly 60 of FIG. 7, with the upper air flow damper 112 partially opened and the lower air flow damper 114 closed. The upper air flow damper 112 is open because a compute module 46 has been received into the chassis bay, resulting in the damper actuator 55 extending through the slot 63 and into contact with the upper pair of damper blades 116. Accordingly, the air flow damper actuator 55 pushes the damper blades open against the biasing force of the springs to an extent directly related to the profile, such as the width and length, of the damper actuator. The damper blades will remain in this position until the damper actuator is removed from contact with the damper blades.

FIG. 9B is perspective view of the fan assembly 60 with the damper blades in a position corresponding to FIG. 9A. The upper damper 112 is now open and the lower damper 114 remains closed. As a result, air flow induced by operation of the fans will be directly primarily through the upper module 46, rather than allowing large volumes of air to bypass or short-circuit the upper module 46 and flow through the empty lower bay of the chassis.

FIGS. 10A and 10B provide a cross-sectional side view and a perspective view of the fan assembly 60 of FIG. 7, with both the upper air flow damper 112 and the lower air flow damper 114 open. The lower air flow damper 114 is opened in the same manner as the upper air flow damper 112 was opened as discussed in relation to FIG. 9A, because the lower bay has receiving a computer module 46. However, the upper air flow damper 112 is opened to a lesser extent, and it has received expansion module 92 (See FIG. 4). Because the expansion module 92 produces a lower thermal load, this module 92 has a damper actuator 57 with a smaller effective profile than damper actuator 55 (for example, a smaller width, smaller length, or both smaller width and length) so that the damper is opened to a lesser extent. It is apparent that these air flow dampers 112, 114 are independently operated (opened and closed) depending upon the presence of a module in the bay that is aligned with the damper. It should be recognized that still other modules, such as an expansion module 102, having a different damper actuator profile will open a corresponding damper to a greater or lesser extent in accordance with the thermal profile of that module.

FIG. 10C provides a cross-sectional side view of the fan assembly 60 of FIG. 10A, wherein each of the individual damper blades 116 include a ramp 117 contacting the damper actuator 55, 57 of the aligned module 46, 92. The ramp 117 does not affect the overall operation of a damper blade, but causes the damper blade 116 to move further out of the air flow pathway for any given damper actuator profile. Accordingly, the same damper actuators 55, 57, are used in FIGS. 10A and 10C, but the dampers 112, 114 in FIG. 10C have opened wider. This may be advantageous in order to allow the dampers to produce a minimum amount of air flow resistance when desired, such as when a compute module is installed.

Figure 11A:
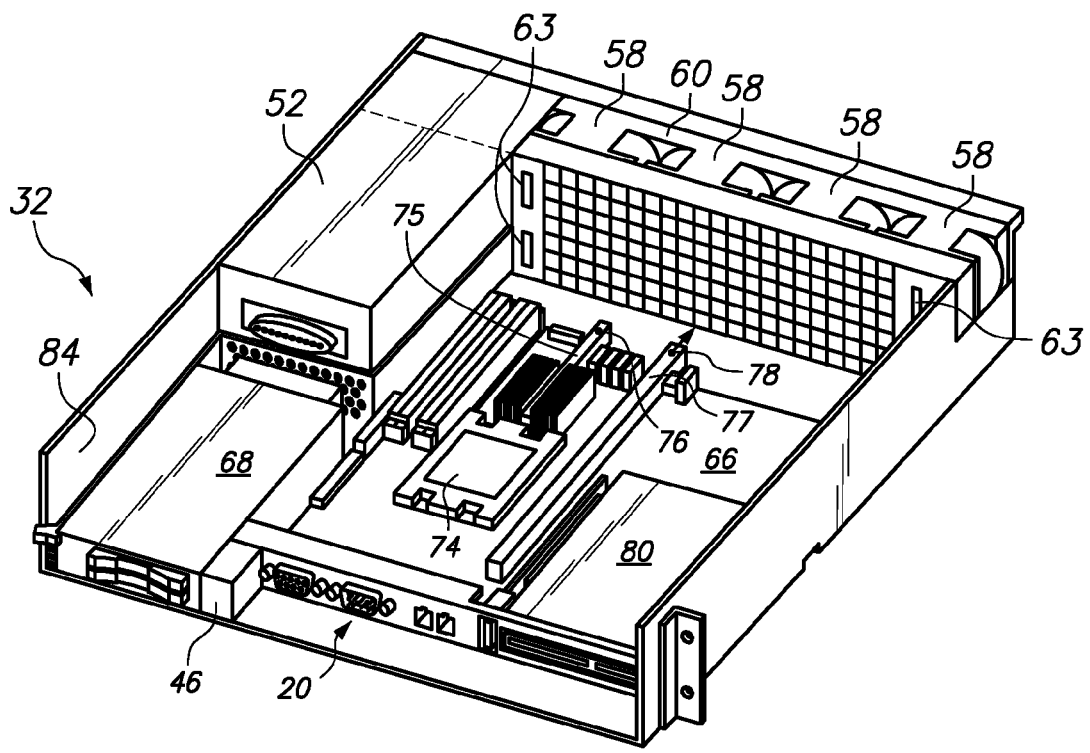
FIG. 11A is a perspective view of a compute module installed in a chassis with the tops of the module and chassis removed.

FIG. 11A is a perspective view of the compute module 46 including an air temperature isolation duct, implemented here as a hot air duct 75. The hot air duct 75 has a generally uniform cross-sectional shape in the form of a rectangular conduit that extends from an inlet end in downstream alignment with the processor 74 to an outlet end along the downstream edge of the circuit board 66. As shown, the hot air duct 75 extends through a heat exchanger so that the air within the hot air duct 75 is prevented from mixing with air that is further heated by the heat exchanger. Furthermore, the hot air duct 75 directs the air heated by the processor 74 to a thermal sensor (thermistor) 76 that may be disposed within, or in direct alignment with, the hot air duct 75. If the processor 74 has a heat exchanger mounted thereon, the hot air duct 75 may have its single inlet disposed to receive substantially only air that is flowing between the heat sink fins. Accordingly, the hot air duct will preferably not extend above the processor heat sink Optionally, the hot air duct 75 may be secured to the heat exchanger, although the duct preferably has a low thermal conductivity to minimize any heat transfer between the heat exchanger and the air within the duct 75. Alternatively, the duct 75 may be secured directly to the circuit board, such as using push tabs.

The first thermal sensor 76 is in electronic communication with a fan controller and sends an electronic output (temperature signal) to the fan controller. The controller may utilize the temperature signal in a control algorithm to adjust the speed of the fans 58 so that the temperature sensed by the first thermal sensor 76 is controlled. For example, the temperature may be controlled at a setpoint temperature or between minimum and maximum temperatures of an operating range.

The embodiment of system 32 shown in FIG. 11A includes an optional second temperature isolation duct, implemented as an ambient air duct 77 secured to the circuit board. The ambient air duct 77 has an inlet end positioned upstream of heat-generating components and an outlet end near the downstream edge of the circuit board 66. Accordingly, the ambient air duct 77 draws in air that is at ambient temperature and transfers the air through the duct to a second thermal sensor 78 within, or in direct alignment with, the ambient air duct 77. The ambient air duct provides the second thermal sensor 78 with ambient air that has not mixed with heated air with the chassis. As a result, the temperature measured by the second thermal sensor is representative of the temperature of ambient air that is being used to cool the system. The second thermal sensor 78 is preferably also in communication with the fan controller, such that the controller may utilize the ambient temperature signal in the control algorithm or system diagnostics. For example, the ambient temperature provides the ability to determine whether temperature changes (such as at point 76) are attributable solely to a rising processor temperature or to a rise in the ambient air temperature entering through the front 20 of the chassis 32.

It should be recognized that the system may include any number of hot air ducts, ambient air ducts, or combinations thereof. However, it is important to understand that the temperature isolation ducts are not used for the purpose of directing cooling air to a hot component. Furthermore, the air passing through the temperature isolation ducts is intentionally designed and positioned to isolate that air from further temperature changes until the temperature has been measured by a downstream thermal sensor. Accordingly, the temperature isolation ducts preferably has a small cross-section, such as ½ inch by ½ inch, so that there is no significant loss, bypassing or isolation of cooling air. Although it is not important that air flow through the temperature isolation ducts at the same exact velocity as the air in the chassis generally, the ducts should not be so small in cross-section that the air experiences significant resistance to flow. An aspect ratio is the magnitude of length in relation to the magnitude of width. For example, a square duct having a uniform cross-section along its entire length may be 4 inches long and have ½ inch width in two dimensions. Therefore, the aspect ratio of the duct is 8 (4 inches ½ inch).

In this embodiment, the fan controller is physically located within the same housing as the power supply 52. Having a fan controller that is separate from the motherboard allows the fan control algorithm to operate independently of any control mechanism embedded in the motherboard, thus avoiding any need to modify associated software parameters. This is discussed further in relation to FIG. 12.

Figure 11B:
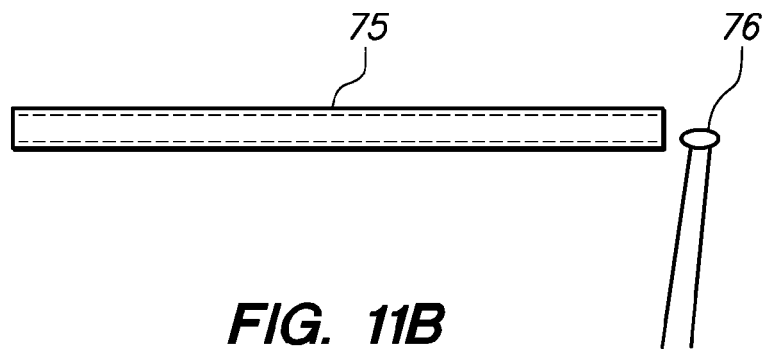
FIGS. 11B and 11C are schematic side views of a thermister in communication with an air duct.
Figure 11C:
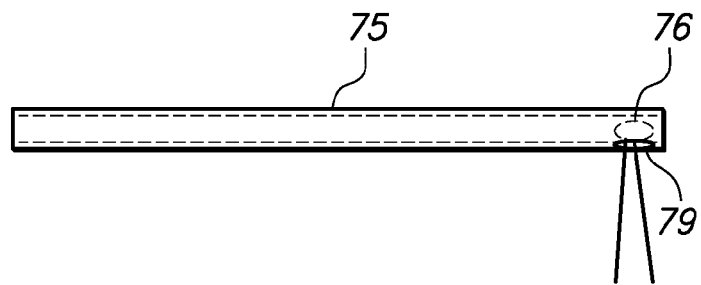

FIGS. 11B and 11C are schematic side views of a thermistor 76 in communication with an air duct 75. In FIG. 11B, the thermistor 76 is in axial alignment with the air duct 75 such that the air flows directly against and around the body of the thermistor. In FIG. 11C, the air duct 75 has a hole 79 in the bottom near the outlet end that allows the thermistor 76 to extend into the duct. Accordingly, air within the duct flows around the thermistor 76 and the duct tends to prevent the thermistor from being exposed to mixed air temperatures.

Figure 12:
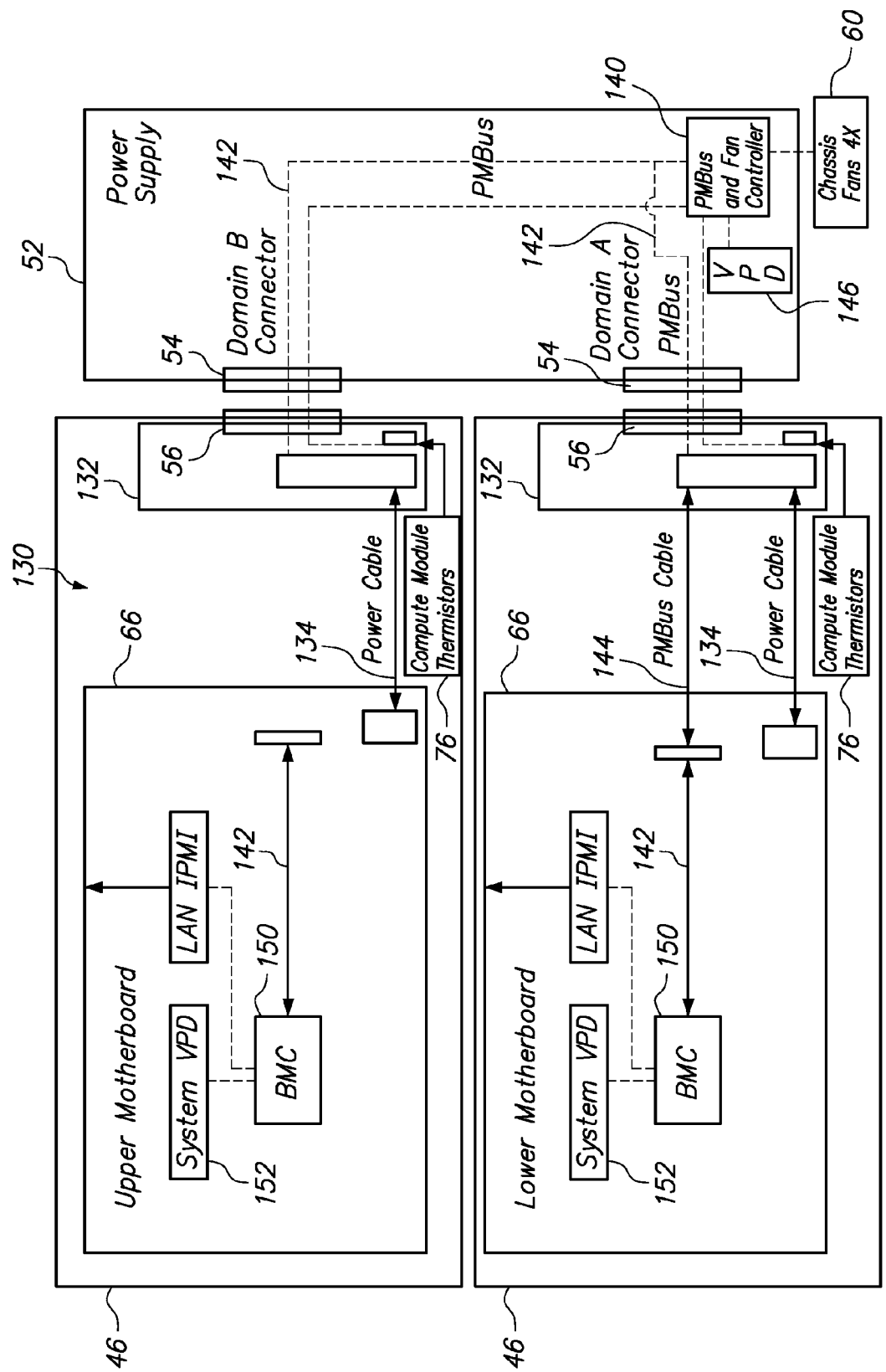
FIG. 12 is a schematic diagram of a system for operating a shared fan assembly.

FIG. 12 is a schematic diagram of a system 130 for operating a shared fan assembly 60. The system 130 shows a power supply 52 having two connectors 54 for coupling with connectors 56 on each of two compute modules 46. Alternatively, the upper module 46 could be replaced with an expansion module (for example, see expansion module 92 of FIG. 4 and expansion module 102 of FIG. 5).

The power supply 52 provides electrical power to a power paddle card 132 in each of the two modules 46. Each power paddle card 132 then transmits electrical power to the motherboard 66 or other components of the module, typically via a cable 134. In each compute module 46, a thermal sensor 76, such as a thermistor, has its output coupled to the power paddle card 132 for communication through the connectors 56, 54 to a fan controller, preferably disposed in a common housing with the power supply 52. The fan controller may be part of a controller 140 that controls both the power management bus (PMBus) 142 and the fans 60. The power management bus 142 is preferably extended to both modules 46, but only the lower motherboard 66 has a power management bus cable 144 for extending the bus to the motherboard 46. Accordingly, the baseboard management controller (BMC) 150 of the lower motherboard 66 can communicate with the fan controller 140 over the power management bus 142 and cable 144. The BMC 150 of both motherboards 66 will store codes associated with its thermal profile settings. As previously described, the codes are provided to the BMC by a software utility that collects a thermal profile identification code for that compute module. The BMC 150 stores the codes in associated memory 152 along with other vital product data. Upon system startup, the lower motherboard BMC 150 sends the codes over the PMBus to the fan controller 140, which may also be able to store the codes in associated memory 146 along with other vital product data. As a result, the fan controller 140 has the appropriate thermal profile settings, such as a minimum fan speed, maximum fan speed, and control loop feedback settings, optimized for control of the modules that are actually installed in the chassis. The fan controller uses these thermal profile settings, along with the output of the chassis thermal sensors 76 to control the speed of the common fan assembly 60 that provides airflow through the entire chassis. Although the fan control algorithm could provide individual fans with different speeds, it will be more likely that each fan in the fan assembly will be controlled at the same speed. Notice that the BMC 150 of the upper motherboard will also attempt to provide the codes to fan controller 140. However, since there is no direct connection path for this information, it will not be transmitted. This mechanism is implemented in order to keep the operation of the lower and upper motherboards uniform.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
   a chassis including a plurality of modules and a fan assembly disposed in a distal end of the chassis for drawing air in parallel pathways through the plurality of modules, wherein at least one of the plurality of modules is a compute module, each compute module including a processor mounted on a motherboard and a thermal sensor disposed to sense the temperature of air flowing across the processor, wherein the thermal sensor provides an output signal that varies according to the temperature; and
   a fan controller receiving output from the thermal sensor of each compute module, wherein the fan controller operates the fan assembly to cool the plurality of modules and maintain the thermal sensor output within an operating temperature range, and wherein the fan controller controls the fan speed according to predetermined thermal profile settings associated with one of the compute modules received in the chassis, wherein the predetermined thermal profile settings include a minimum fan speed, a maximum fan speed, and control loop feedback settings.

2. The system of claim 1, wherein the chassis further comprises a shared power supply providing electricity to the fan assembly and each module received within the chassis.

3. The system of claim 2, wherein each module includes a power paddle card for selective coupling to the power supply.

4. The system of claim 3, wherein the thermal sensor of each compute module is electronically coupled to the power paddle card, and wherein the fan controller is electronically coupled to the power card.

5. The system of claim 4, wherein the fan controller is disposed within a common housing with the power supply.

6. The system of claim 1, wherein each compute module further includes a baseboard management controller capable of electronic communication with the fan controller.

7. The system of claim 6, wherein the baseboard management controller communicates with the fan controller through a power paddle card.

8. The system of claim 6, wherein the baseboard management controller stores thermal profile settings for the plurality of modules received in the chassis.

9. The system of claim 8, wherein the baseboard management controller communicates the thermal profile settings to the fan controller.

10. The system of claim 9, wherein the thermal profile settings are stored by the baseboard management controller and sent to the fan controller as power management bus codes.

11. The system of claim 9, wherein the chassis includes a plurality of module bays, wherein only one of the module bays has a power management bus connection to extend the power management bus of a compute module motherboard into communication with the fan controller.

12. The system of claim 1, wherein the at least one compute module has a baseboard management controller, and wherein the compute module communicates with the fan controller over a power management bus.

13. The system of claim 1, wherein the plurality of modules includes only one compute module, and wherein the fan controller operates the fan assembly to control the processor temperature of the compute module as sensed by the thermal sensor.

14. The system of claim 1, wherein the plurality of modules includes two compute modules, the fan controller receives output from the thermal sensor of each of the two compute modules, and the fan controller operates the fan assembly to control the processor temperature of the compute module having the thermal sensor with the highest temperature.

15. The system of claim 1, wherein the thermal sensor is coupled to a heatsink on the compute module motherboard.

16. The system of claim 1, wherein the chassis is a 2U chassis, the fan assembly includes a plurality of 2U fans, and the two or more modules are 1U modules.

17. A method comprising:
  installing a plurality of modules into a chassis having a fan controller and fan assembly disposed in a distal end of the chassis for drawing air in parallel pathways through the plurality of modules, wherein at least one of the plurality of modules is a compute module, each compute module including a processor mounted on a motherboard and a thermal sensor disposed to sense the temperature of air flowing across the processor;
  providing thermal profile settings to the fan controller from one of the compute modules installed in the chassis;
  operating the fan controller using the predetermined thermal profile settings, wherein the predetermined thermal profile settings include control loop feedback settings;
  operating the plurality of modules under a varying workload;
  sensing the temperature of air downstream of the processor; and
  controlling the speed of the fan assembly as a function of the sensed temperature and the control loop feedback settings of the plurality of modules installed in chassis.

18. The method of claim 17, wherein the plurality of installed modules includes two compute modules, the method further comprising:
  sensing the temperature of air downstream of the processor in each of the two compute modules;
  determining which of sensed temperatures is greater; and
  controlling the speed of the fan assembly as a function of the greater sensed temperature.

19. The method of claim 17, wherein the thermal profile settings are provided to the fan controller from a baseboard management controller on the compute module.

20. The method of claim 19, further comprising:
  storing the thermal profile settings for each of the installed compute modules within memory accessible to the baseboard management controller.

21. The method of claim 19, further comprising:
  sending the thermal profile settings to the fan controller as PMBus codes.

22. The method of claim 21, wherein the chassis includes a plurality of module bays, wherein only one of the module bays has a power management bus connection to extend the power management bus of a compute module motherboard into communication with the fan controller.

23. The system of claim 17, wherein the chassis is a 2U chassis, the fan assembly includes a plurality of 2U fans, and the plurality of modules are each 1U modules.

24. The method of claim 17, wherein the step of controlling the speed of the fan assembly includes maintaining the temperature within an operating range.

25. The method of claim 17, further comprising:
  incrementally varying the fan speed between a minimum fan speed and a maximum fan speed.

* * * * *